United States Patent
Palumbo

(10) Patent No.: US 10,772,231 B2
(45) Date of Patent: Sep. 8, 2020

(54) PATCH PANEL INCLUDING A DEVICE FOR ATTACHING A PLUG-IN MODULE

(71) Applicants: LEGRAND SNC, Limoges (FR); LEGRAND FRANCE, Limoges (FR)

(72) Inventor: Alain Palumbo, Chatuzange le Goubet (FR)

(73) Assignees: LEGRAND SNC, Limoges (FR); LEGRAND FRANCE, Limoges (FR)

( * ) Notice: Subject to any disclaimer, the term of this patent is extended or adjusted under 35 U.S.C. 154(b) by 0 days.

(21) Appl. No.: 15/776,909

(22) PCT Filed: Oct. 28, 2016

(86) PCT No.: PCT/FR2016/052811
§ 371 (c)(1),
(2) Date: May 17, 2018

(87) PCT Pub. No.: WO2017/085371
PCT Pub. Date: May 26, 2017

(65) Prior Publication Data
US 2018/0343762 A1    Nov. 29, 2018

(30) Foreign Application Priority Data

Nov. 17, 2015 (FR) ..................... 15 61032

(51) Int. Cl.
*G06F 1/16* (2006.01)
*H05K 5/00* (2006.01)
(Continued)

(52) U.S. Cl.
CPC ......... *H05K 7/1454* (2013.01); *H01R 31/005* (2013.01); *H04Q 1/023* (2013.01);
(Continued)

(58) Field of Classification Search
CPC .... H05K 7/1454; H05K 7/186; H01R 31/005; H04Q 1/023; H04Q 1/13
(Continued)

(56) References Cited

U.S. PATENT DOCUMENTS

| | | | | | |
|---|---|---|---|---|---|
| 5,161,028 A | * | 11/1992 | Kawata | .................. | B60K 37/02 348/837 |
| 5,173,686 A | * | 12/1992 | Fujihara | .................... | G09F 9/35 248/920 |

(Continued)

OTHER PUBLICATIONS

International Search Report and Written Opinion for PCT Patent App. No. PCT/FR2016/052811 (dated Feb. 22, 2017) with English language translation of the ISR.

*Primary Examiner* — Anthony M Haughton
(74) *Attorney, Agent, or Firm* — Kenealy Vaidya LLP

(57) ABSTRACT

Some embodiments are directed to a patch panel including a frame, at least one plug-in module including connectors, arranged in such a way as to slide between a pushed-in position in which the plug-in module is placed in a housing in the frame and an extracted position in which the plug-in module is outside the housing, the panel further including a device for attaching the plug-in module to the frame, the attachment device including: at least one flexible elongate body arranged in such a way as to slide with respect to the frame and/or to the plug-in module; a first end designed to attach the plug-in module to the attachment device when the plug-in module is in the extracted position; and a second end designed to attached the attachment device to the frame when the plug-in module is in the extracted position.

18 Claims, 2 Drawing Sheets

(51) Int. Cl.
  *H05K 7/00* (2006.01)
  *H05K 7/14* (2006.01)
  *H04Q 1/02* (2006.01)
  *H01R 31/00* (2006.01)
  *H05K 7/18* (2006.01)
  *H01R 24/64* (2011.01)
  *H01R 107/00* (2006.01)

(52) U.S. Cl.
  CPC .............. *H04Q 1/13* (2013.01); *H05K 7/186* (2013.01); *H01R 24/64* (2013.01); *H01R 2107/00* (2013.01)

(58) Field of Classification Search
  USPC .......................... 361/679.4–679.43, 724–727
  See application file for complete search history.

(56) References Cited

U.S. PATENT DOCUMENTS

| | | | | |
|---|---|---|---|---|
| 5,754,084 A * | 5/1998 | Hietala | ..................... | H01P 1/30 333/229 |
| 6,407,933 B1 * | 6/2002 | Bolognia | ............. | H05K 7/1491 174/168 |
| 6,535,391 B2 * | 3/2003 | Larsen | ................... | G06F 1/184 312/223.1 |
| 6,586,410 B1 * | 7/2003 | Wheeler | .............. | A61K 9/1272 424/450 |
| 6,778,381 B1 * | 8/2004 | Bolognia | ................ | G06F 1/183 312/223.2 |
| 6,788,544 B1 * | 9/2004 | Barsun | ................ | H05K 7/1421 361/727 |
| 7,436,674 B2 * | 10/2008 | Barsun | ................. | G06F 1/1601 312/223.1 |
| 7,474,229 B2 * | 1/2009 | Franz | ..................... | G06F 1/181 340/679 |
| 8,538,226 B2 * | 9/2013 | Makrides-Saravanos | ................... | G02B 6/4455 385/135 |
| 9,943,002 B2 * | 4/2018 | Manda | ................ | G11B 33/128 |
| 2002/0117942 A1 | 8/2002 | Audibert et al. | | |
| 2006/0018622 A1 | 1/2006 | Caveney et al. | | |
| 2007/0115627 A1 * | 5/2007 | Carlisi | ................... | G06F 1/183 361/679.01 |
| 2010/0172087 A1 * | 7/2010 | Jeffery | .................. | G11B 33/02 361/679.33 |
| 2010/0310225 A1 | 12/2010 | Anderson et al. | | |
| 2014/0204537 A1 * | 7/2014 | Rust | ........................ | H05K 7/02 361/727 |

* cited by examiner

PATCH PANEL INCLUDING A DEVICE FOR ATTACHING A PLUG-IN MODULE

CROSS REFERENCE TO RELATED APPLICATIONS

This application is a national phase filing under 35 C.F.R. § 371 of and claims priority to PCT Patent Application No. PCT/FR2016/052811, filed on Oct. 28, 2016, which claims the priority benefit under 35 U.S.C. § 119 of French Patent Application No. 1561032, filed on Nov. 17, 2015, the contents of each of which are hereby incorporated in their entireties by reference.

BACKGROUND

Some embodiments relate to installations of IT and telecommunications networks, and more particularly to a patch panel and associated device for attaching to a drawer.

A patch panel makes it possible to make the links between several cables connected to the various ports of the panel by connecting the ports concerned by patch cords. In particular, the patch panels of RJ45 connectors make it possible to create a cabling between the twisted pair cables and RJ45 cords in order to establish the links between various peripheral devices.

Certain panels include drawers placed in a frame in dedicated housings that make it possible to slide a row of connectors supported by the drawer in order to allow for easier access to the cables connected to the connectors.

Current panels are not designed in such a way that the drawer support of connectors is entirely extracted outside of the frame of the patch panel during the mounting of the cables. The opening in the front face of the panel is thus not sufficiently cleared to allow for an ergonomic mounting of the cables and of the connectors inside the panel.

SUMMARY

Moreover, in accordance with the related art, during the work site for installing the panel, the drawers are placed away from the zone of intervention, and even placed on the floor, before being mounted, which can cause accidental degradations to the drawers.

Some embodiments address or overcome the aforementioned disadvantages, such as to maintain a drawer attached to the frame when it is entirely extracted from its housing.

Some embodiments relate to a patch panel including a frame, at least one drawer including connectors, arranged in such a way as to slide between a pushed-in position in which the drawer is placed in a housing in the frame and an extracted position in which the drawer is outside the housing, i.e., entirely dissociated from the frame. The panel can also include a device for attaching the drawer to the frame, the attachment device including at least one flexible elongate body arranged in such a way as to slide with respect to the frame and/or to the drawer; a first end designed to attach the drawer to the attachment device in the extracted position of the drawer; and a second end designed to attach the attachment device to the frame in the extracted position of the drawer.

The term "patch panel" means a device including a plurality of connectors, used in installations of IT and telecommunications networks to connect various peripheral devices together through links established between connectors of the panel.

According to a particular embodiment, the drawer and/or the frame includes a passage arranged in such a way as to allow the at least one elongate body to slide therein.

According to a particular embodiment, the first end includes an abutment arranged in such a way as to abut against the passage when the drawer is in the extracted position; and/or the second end includes an abutment arranged in such a way as to abut against the passage when the drawer is in the extracted position.

According to a particular embodiment, the passage includes a portion arranged in such a way as to allow for the insertion of the abutment into the passage via the portion in the assembly phase.

According to a particular embodiment, the abutment includes a flared and recessed shape at its centre, able to be deformed in such a way as to allow for a forced entry into the passage.

According to a particular embodiment, the drawer and/or the frame includes a slide arranged in such a way as to allow the at least one elongate body to slide therein. Advantageously, the portion of the passage that allows for the insertion of the abutment is located in the slide.

According to a particular embodiment, the first end is fixed to the drawer.

According to a particular embodiment, the first end is arranged in such a way as to slide with respect to a first passage and the second end is arranged in such a way as to slide with respect to a second passage.

According to a particular embodiment, the second end is fixed to the frame.

According to a particular embodiment, the frame including a sliding plane on which the drawer slides, the at least one elongate body includes a flat surface able to slide on the sliding plane.

According to a particular embodiment, the at least one elongate body is made of a thermoplastic material such as polypropylene.

BRIEF DESCRIPTION OF THE FIGURES

Other characteristics and innovative advantages shall appear in the description hereinafter, provided for the purpose of information and is in no way limiting, in reference to the annexed drawings, wherein.

DETAILED DESCRIPTION OF EXEMPLARY EMBODIMENTS

Figure 1:
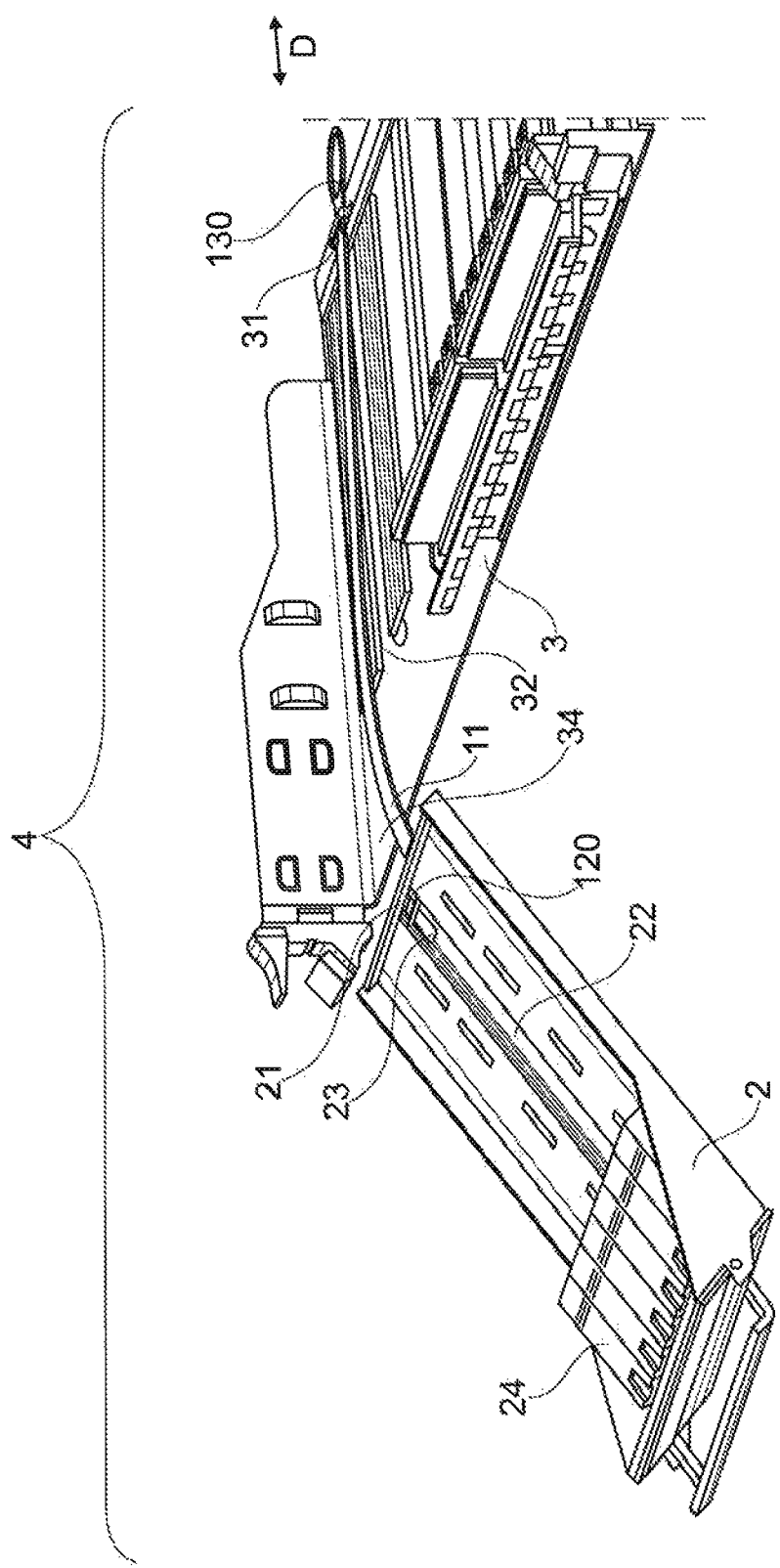
FIG. 1 diagrammatically shows a first embodiment of the presently disclosed subject matter.
Figure 2:
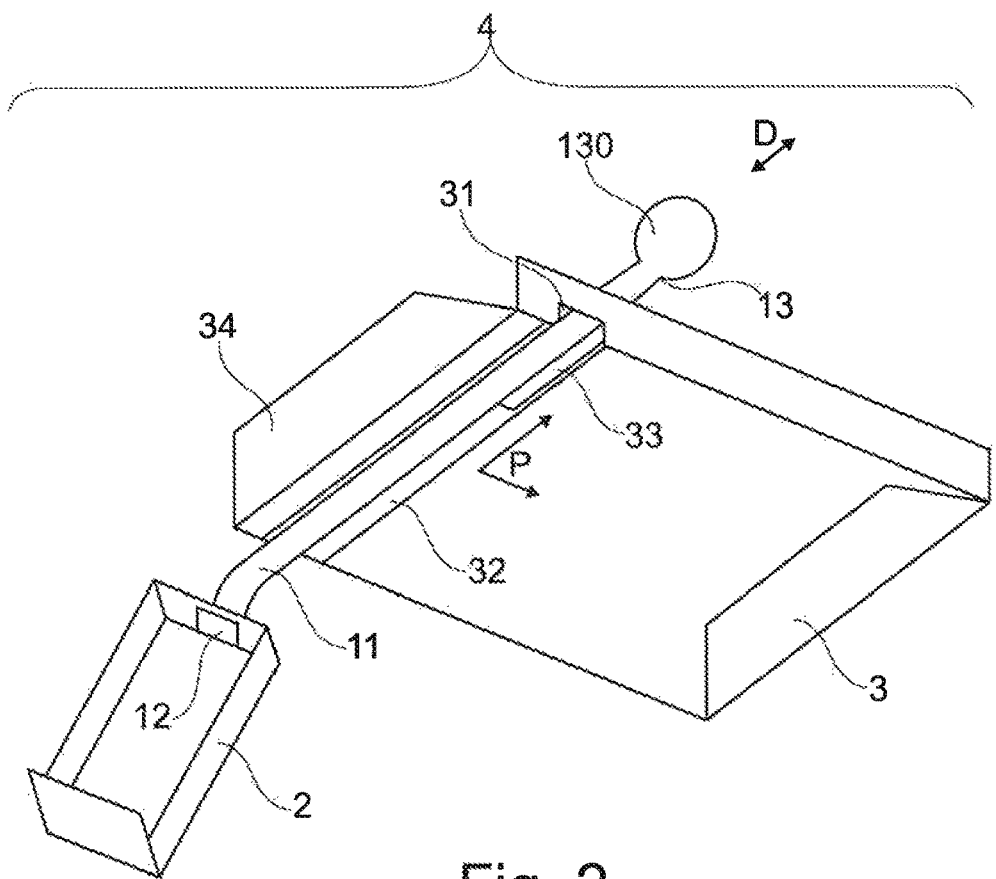
FIG. 2 diagrammatically shows a second embodiment of the presently disclosed subject matter.
Figure 3:
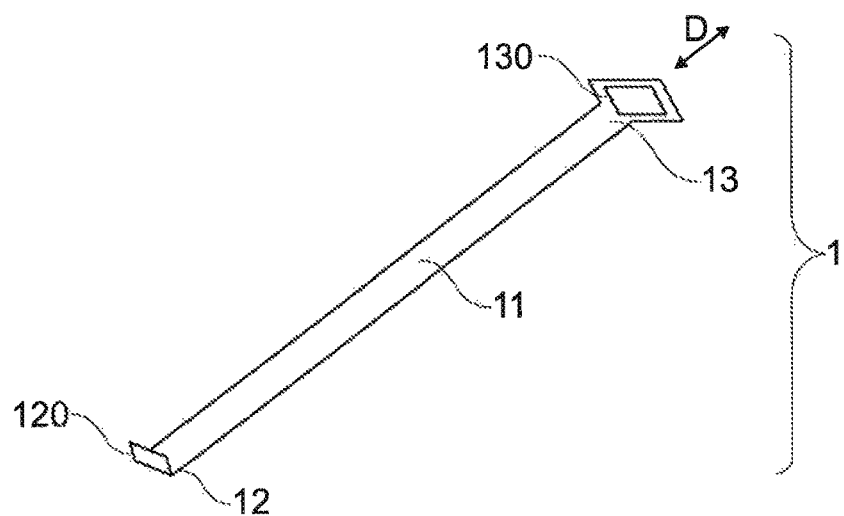
FIG. 3 diagrammatically shows a schematic view of the device for anchoring of a third embodiment of the presently disclosed subject matter.

FIGS. 1 to 3 show a patch panel 4. According to a first embodiment shown in FIG. 1, the panel 4 is a panel of RJ45 connectors.

The panel 4 includes a frame 3, a drawer 2 support for connectors and a device 1 for attaching the drawer 2 to the frame 3.

The drawer 2 is arranged in such a way as to slide in a housing of the frame 3 according to a direction D of sliding and on a sliding plane P. The drawer 2 has a pushed-in position wherein the drawer 2 is placed in the housing and an extracted position in which the drawer 2 is outside the housing. The drawer is extracted from the frame by an opening 34 of the frame.

The drawer 2 includes connectors 24 fastened on the front face of the drawer 2 and forming at least one row of connectors. The front face of the drawer 2 is the face that at least partially occults the opening 34 when the drawer 2 is in the pushed-in position.

In reference more particularly to FIG. 3, the device 1 for attaching includes an elongate body 11 according to the direction D of sliding, a first end 12 designed to attach the drawer 2 to the device 1 in the extracted position of the drawer 2 and a second end 13 designed to attach the device 1 to the frame 3 in the extracted position of the drawer 2.

In reference to FIG. 1, the frame 3 includes a passage 31 arranged in a ring in such a way as to allow the elongate body 11 to slide therein. FIG. 2 shows a different embodiment wherein the passage 31 in a through-orifice in the rear face of the frame, with the rear face being opposite the opening 34. Alternatively, the passage is arranged in a protrusion of the horizontal face of the frame 3 whereon slides the drawer 2 parallel to the sliding plane P.

In reference to FIGS. 1 and 3, the end 13 of the device 1 includes a flared and recessed shape at its centre, able to be deformed, while allows for a forced entry into the passage 31. The flared shape is arranged in such a way as to abut against the passage 31 when the drawer 2 is in the extracted position. The abutment obtained as such makes it possible to block the sliding of the elongate body 11 into the passage and as such maintain the device 1 attached to the frame 3. Advantageously, the flared shape is parallelepiped, cylindrical or prismatic. FIG. 2 shows a different embodiment wherein the end 13 includes a solid and spherical flared shape. Alternatively, the flared shape has another shape allowing for an abutment with the passage. According to an advantageous or preferred embodiment, the passage 31 includes a first portion for insertion 33 arranged in such a way as to allow for the insertion of the end 13 into the passage 31 via the first portion of insertion 33 in the assembly phase. The first portion of insertion 33 is arranged in such a way as to block the exit of the end 13 by the passage 31 when the drawer 2 slides on the sliding plane P.

The frame 3 includes a slide 32 arranged in such a way as to guide the sliding of the device 1 in the frame 3. According to an advantageous or preferred embodiment, the first portion of insertion 33 is located in the slide 32.

In reference to FIG. 1, the drawer 2 includes a passage 21, in the form of a through-hole in the rear face of the drawer 2 opposite the face including the connectors, arranged in such a way as to allow the elongate body 11 to slide therein. According to various embodiments, the passage 21 is an orifice in the ring fixed to the drawer 2 or an orifice in a protrusion of a face of the drawer such as the lower face of the drawer 2 intended to rest on the sliding plane P.

According to a particular embodiment not shown, the passage 21 includes a second portion of insertion 23 arranged in such a way as to allow for the insertion of the end 12 into the passage 21 via the second portion of insertion in the assembly phase, in a way similar to that which is described for the first portion of insertion 33.

The drawer 2 includes a slide 22 arranged in such a way as to guide the sliding of the device 1 in the drawer 2. According to the embodiment of FIG. 1, the second portion of insertion 23 is located in the slide 22.

In the embodiment of FIG. 1, the device 1 slides with respect to the frame 3 and in relation to the drawer 2.

FIG. 2 shows a patch panel 4 according to a second embodiment of the presently disclosed subject matter. In this second embodiment, the end 12 is fastened to the drawer 2. The following modes of fastening make it possible to fasten the end 12 to the drawer 2: thermo-welding, screwing, snap-fitting. In this embodiment, the device 1 slides with respect to the frame 3 but is fixed in relation to the drawer 2.

According to an embodiment not shown, the end 13 is fastened to the frame 3. The modes for fastening mentioned in the preceding paragraph make it possible to fasten the end 13 to the frame 3. In this embodiment, the device 1 slides in relation to the drawer 2 but is fixed with respect to the frame 3.

Some embodiments described hereinabove by way of example. It is understood that those of ordinary skill in the art are able to create different alternative embodiments, by combining for example the various characteristics hereinabove taken individually or in combination, without however leaving the scope of some embodiments.

The invention claimed is:

1. A patch panel, comprising:
   a frame;
   a housing in the frame;
   at least one drawer including connectors, arranged in such a way as to slide between a pushed-in position in which the drawer is placed in the housing in the frame, and an extracted position in which the drawer is outside the housing completely dissociated from the frame; and
   an attachment device for attaching the drawer to the frame, the attachment device including: at least one flexible elongate body arranged in such a way as to slide with respect to the frame and to the drawer; a first end designed to attach the drawer to the attachment device in the extracted position of the drawer; and a second end designed to attach the attachment device to the frame in the extracted position of the drawer;
   wherein the drawer and the frame include a slide arranged in such a way as to allow the at least one elongate body to slide, the frame includes a sliding plane on which the drawer slides, the at least one elongate body includes a flat surface able to slide on the sliding plane, and in the frame, the at least one elongate body extends in the sliding plane only.

2. The panel as claimed in claim 1, wherein the drawer and/or the frame includes a passage arranged in such a way as to allow the at least one elongate body to slide therein.

3. The panel as claimed in claim 2, wherein:
   the first end includes an abutment arranged in such a way as to abut against a first passage when the drawer is in the extracted position; and/or
   the second end an abutment arranged in such a way as to abut against a second passage when the drawer is in the extracted position.

4. The panel as claimed in claim 3, wherein the passage includes a portion arranged in such a way as to allow for the insertion of the abutment into the passage via the portion.

5. The panel according to claim 3, wherein the abutment includes a flared and recessed shape at its centre, able to be deformed in such a way as to allow for a forced entry into the passage.

6. The panel as claimed in claim 1, wherein the first end is fixed to the drawer.

7. The panel according to claim 2, wherein the first end is arranged in such a way as to slide with respect to a first passage, and the second end is arranged in such a way as to slide with respect to a second passage.

8. The panel as claimed in claim 1, wherein the at least one elongate body is made of a thermoplastic material including polypropylene.

9. The panel according to claim 4, wherein the abutment includes a flared and recessed shape at its centre, able to be deformed in such a way as to allow for a forced entry into the passage.

10. The panel as claimed in claim 2, wherein the drawer and/or the frame comprises a slide arranged in such a way as to allow the at least one elongate body to slide therein.

11. The panel as claimed in claim 3, wherein the drawer and/or the frame comprises a slide arranged in such a way as to allow the at least one elongate body to slide therein.

12. The panel as claimed in claim 4, wherein the drawer and/or the frame comprises a slide arranged in such a way as to allow the at least one elongate body to slide therein.

13. The panel as claimed in claim 5, wherein the drawer and/or the frame comprises a slide arranged in such a way as to allow the at least one elongate body to slide therein.

14. The panel as claimed in claim 2, wherein the first end is fixed to the drawer.

15. The panel as claimed in claim 3, wherein the first end is fixed to the drawer.

16. The panel as claimed in claim 4, wherein the first end is fixed to the drawer.

17. The panel as claimed in claim 5, wherein the first end is fixed to the drawer.

18. The panel as claimed in claim 1, wherein the first end is fixed to the drawer.

\* \* \* \* \*